United States Patent [19]

Arakawa et al.

[11] Patent Number: 4,601,020
[45] Date of Patent: Jul. 15, 1986

[54] SEMICONDUCTOR MEMORY DEVICE

[75] Inventors: Hideki Arakawa; Hiromi Kawashima, both of Yokohama, Japan

[73] Assignee: Fujitsu Limited, Kawasaki, Japan

[21] Appl. No.: 566,321

[22] Filed: Dec. 28, 1983

[30] Foreign Application Priority Data

Dec. 29, 1982 [JP] Japan .................. 57-229267

[51] Int. Cl.⁴ .......................... G11C 11/40
[52] U.S. Cl. .................. 365/226; 365/185; 365/191
[58] Field of Search ............ 365/185, 189, 191, 226

[56] References Cited

U.S. PATENT DOCUMENTS 4,506,350  3/1985  Asano et al. ............ 365/226 X

FOREIGN PATENT DOCUMENTS 2094086  9/1982  United Kingdom .

OTHER PUBLICATIONS

IBM Technical Disclosure Bulletin, vol. 23, No. 10, Mar. 1981, "Bit Line Selection Circuit for Programming Level Voltages in an Electrically Alterable Read-Only Storage", by P. C. Tien.

Primary Examiner—Joseph A. Popek
Attorney, Agent, or Firm—Staas & Halsey

[57] ABSTRACT

An EEPROM utilizing a tunneling electron for writing and/or erasing, has charge pump circuits for pumping charge onto selected column and row lines up to a high voltage. In each of the charge pump circuits, a transistor is provided for intercepting clock pulses applied to a capacitor in each of the charge pump circuits connected to unselected column and row lines.

9 Claims, 4 Drawing Figures

SEMICONDUCTOR MEMORY DEVICE

BACKGROUND OF THE INVENTION

1. Field of the Invention

The present invention relates to a semiconductor memory device, in particular to an electrically erasable nonvolatile semiconductor memory device having charge pump circuits for providing a high voltage necessary to write or erase information in the memory device.

2. Description of the Prior Art

An electrically erasable and programmable read only memory (EEPROM) in general requires a high voltage of 21 V to 25 V for writing and erasing in addition to a low voltage of 5 V. According to older designs, since an EEPROM requires a large current and a high voltage for writing and erasing, it is necessary to provide an external high voltage supply along with an external low voltage supply.

Recently, new EEPROM cells with thin dielectrics utilizing a tunneling electron for writing and erasing have been proposed. According to such new cells, the current required for writing and erasing can be reduced, and dc current paths during writing and erasing can be eliminated. As a result, it is possible to put a voltage multiplier on the chip to generate the high voltage required to effect tunneling and to gradually transfer the high voltage to the selected column and row lines by charge pump circuits, which are connected to respective column and row lines.

The charge pump circuits are driven by clock pulses from a clock generator. However, according to the above prior art, since the clock pulses from the clock generator are applied to all the charge pump circuits and charge a capacitor in each of the charge pump circuits, even though that charge pump circuit is connected to the unselected column or row line, the load of the clock generator becomes extremely heavy.

SUMMARY OF THE INVENTION

It is, therefore, an object of the present invention to provide a semiconductor memory device which can greatly reduce the load of a clock generator for generating clock pulses used for driving charge pump circuits.

According to the present invention, the above object is achieved by a semiconductor memory device including: a plurality of column lines; a plurality of row lines; a column decoder connected to the column lines for selecting one of the column lines; a row decoder connected to the row lines for selecting one of the row lines; a plurality of storage cells, one of which is accessed by the selected column line and the selected row line; a clock generator for producing clock pulses; a voltage supply for supplying a high voltage; and a plurality of charge pump circuits each of which is connected to one of the column lines and row lines, respectively, and connected to the clock generator, for increasing the voltage on the selected column and row lines up to the high voltage required during writing and/or erasing operations. Each of the charge pump circuits includes a capacitor for charging and discharging in response to the clock pulses from the clock generator; a charge transfer transistor connected to the capacitor, for gradually transferring charge from the voltage supply to the column or row line connected thereto, in response to voltage on the capacitor; and a gate circuit connected between the clock generator and the capacitor, for cutting off the capacitor in the charge pump circuit connected to an unselected column line or unselected row line of the clock generator.

Since the capacitors in the charge pump circuits connected to unselected column and row lines are cut off from the clock generator, according to the present invention, the load of the clock generator becomes extremely light and thus the size of the clock generator can be reduced. Furthermore, the capacitance of a voltage multiplier, for producing the high voltage, can be reduced.

DESCRIPTION OF THE PREFERRED EMBODIMENT

Figure 1:
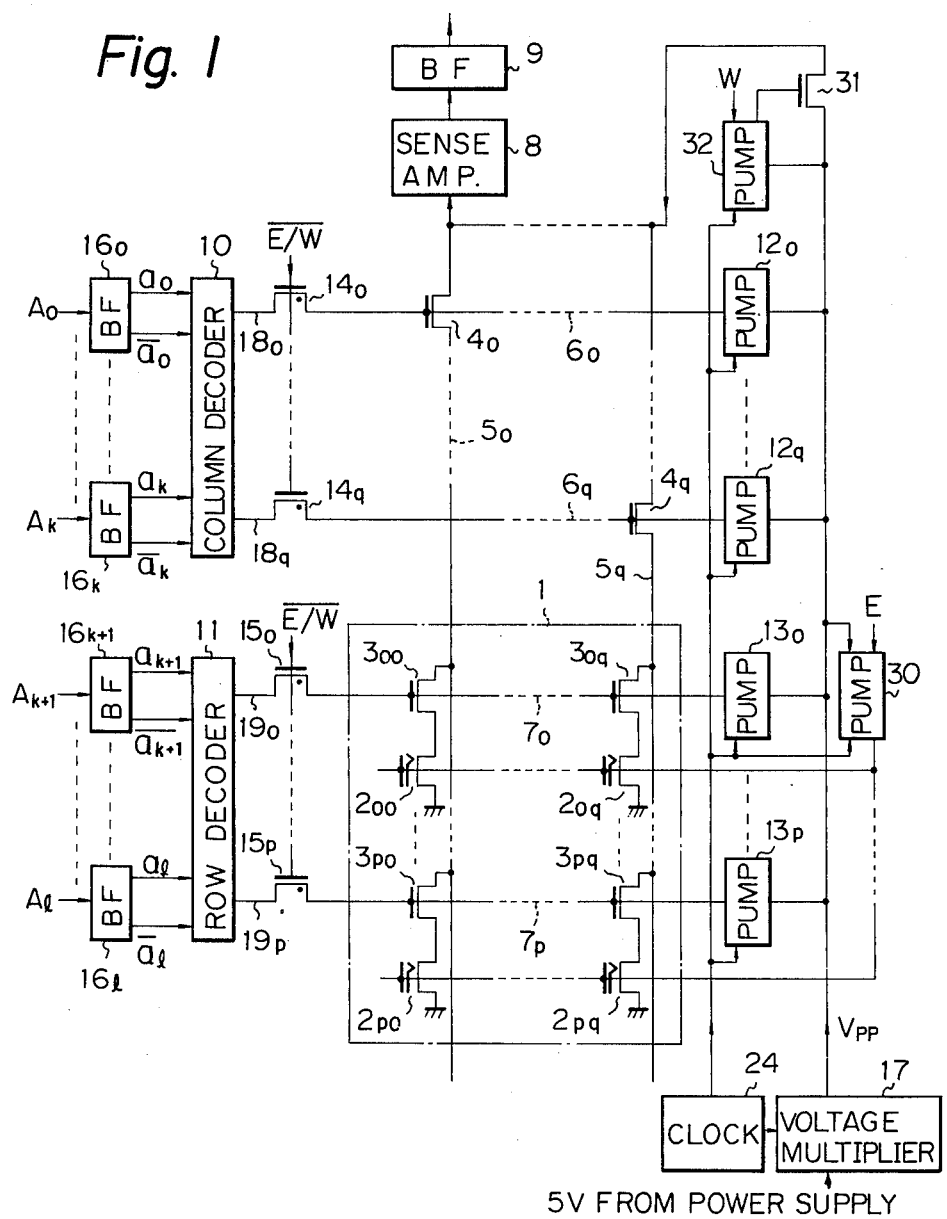
FIG. 1 is a circuit diagram according to an embodiment of the present invention.

Referring to FIG. 1, which is an EEPROM utilizing a tunneling electron for writing and erasing, reference numeral 1 denotes a memory cell array, $2_{00}$ to $2_{pq}$ represent memory transistors, and $3_{00}$ to $3_{pq}$ represent select transistors. Each one of the memory transistors $2_{00}$ to $2_{pq}$ and each one of the select transistors $3_{00}$ to $3_{pq}$ form a memory cell. The select transistors $3_{00}$ to $3_{pq}$ are connected to bit lines $5_0$ to $5_9$. The bit lines $5_0$ to $5_q$ are connected to a sense amplifier 8 via bit line selection transistors $4_0$ to $4_q$, respectively. The sense amplifier 8 is connected to an output buffer 9. In FIG. 1, a one word-one bit EEPROM is illustrated. If the EEPROM has a one word-eight bits construction, eight times the memory cell arrays, sense amplifiers, and accompanying lines are necessary. The gates of the bit line selection transistors $4_0$ to $4_q$ are connected to column lines $6_0$ to $6_q$, respectively. One end of the column lines $6_0$ to $6_q$ are connected to a column decoder 10 via transfer gates $14_0$ to $14_q$ comprising depletion transistors, respectively. The other end of the column lines $6_0$ to $6_q$ are connected to charge pump circuits $12_0$ to $12_q$, respectively. Gates of the select transistors $3_{00}$ to $3_{pq}$ are connected to row lines $7_0$ to $7_p$. One end of the row lines $7_0$ to $7_p$ are connected to a row decoder 11 via transfer gates $15_0$ to $15_p$ made of depletion transistors having a threshold voltage less than $-5$ V, respectively. The other end of the row lines $7_0$ to $7_p$ are connected to charge pump circuits $13_0$ to $13_p$, respectively. The gates of the memory transistors $2_{00}$ to $2_{pq}$ are connected to a charge pump circuit 30. The bit lines $5_0$ to $5_q$ are also connected to a voltage multiplier 17 for producing a high voltage of 21 V to 25 V via a transistor 31 and via the bit line selection transistors $4_0$ to $4_q$.

The gate of the transistor 31 is connected to a charge pump circuit 32. All of the charge pump circuits $12_0$ to $12_q$, $13_0$ to $13_q$, 30 and 32 are connected to the voltage multiplier 17 and to a clock generator 24. The column decoder 10 and the row decoder 11 are connected to address buffers $16_0$ to $16_k$ and $16_{k+1}$ to $16_l$, respectively.

In the case of reading, for example, in the case of reading out information stored in the memory transistor $2_{00}$, addresses $A_0$ to $A_l$ for accessing the memory transistor $2_{00}$ are applied to the column decoder 10 and the row decoder 11 via the address buffers $16_0$ to $16_l$. Thus, the column decoder 10 supplies a voltage of 5 V to an output line $18_0$ and grounds output lines $18_1$ to $18_q$. The row decoder 11 supplies a voltage of 5 V to an output line $19_o$ and grounds output lines $19_1$ to $19_p$.

Figure 2:
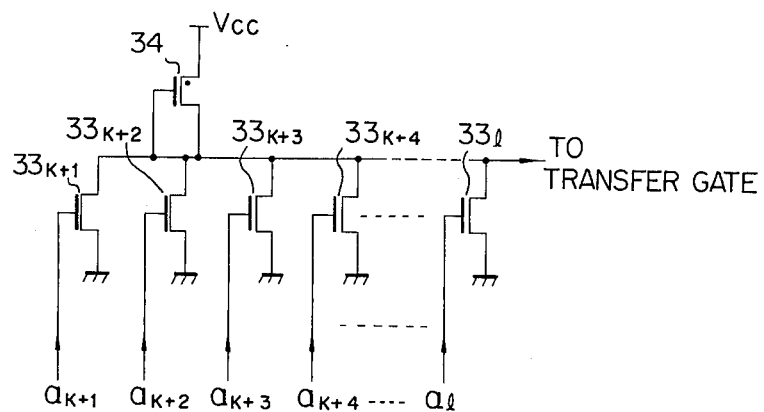
FIG. 2 is a circuit diagram of part of a row decoder in the embodiment shown in FIG. 1.

FIG. 2 is a circuit diagram of a part of the row decoder 11 for one row line (one output line). In the above-mentioned case, if the circuit in FIG. 2 decodes the output for the output line $19_0$, all transistors $33_{k+1}$ to $33_l$ will turn off and a transistor 34 will turn on. Therefore, a $V_{CC}$ voltage of 5 V is supplied to the output line $19_0$. If the circuit in FIG. 2 decodes the output for one of the output lines $19_1$ to $19_p$, at least one of the transistors $33_{k+1}$ to $33_l$ will turn on, causing the output line to be grounded.

Since all the transfer gates $14_0$ to $14_q$ and $15_0$ to $15_p$ are in the on state during reading, the bit line selection transistor $4_0$ turns on and the select transistor $3_{00}$ is energized when the voltage of 5 V is supplied to the output lines $18_0$ and $19_0$. As a result, information stored in the memory transistor $2_{00}$ is detected by the sense amplifier 8.

In the case of erasing or writing, the operation of the column and row decoders 10 and 11 is the same as that during reading. However, in this case, the gates of the depletion transistors, which form the transfer gates $14_0$ to $14_q$ and $15_0$ to $15_p$, are grounded after the column decoder 10 and the row decoder 11 select one of the column lines and one of the row lines. Furthermore, during erasing and writing, one of the charge pump circuits $12_0$ to $12_q$ connected to the selected column line, and one of the charge pump circuits $13_0$ to $13_p$ connected to the selected row line, operate to increase the voltage on the column and row lines up to the high voltage $V_{PP}$ boosted by the voltage multiplier 17. Namely, the voltage multiplier 17 boosts the supply voltage of 5 V to the high voltage $V_{PP}$ of 20 V to 25 V, and the charge pump circuits gradually transfer charge from the voltage multiplier 17 via a high voltage line $V_{PP}$ to the selected column and row lines. As mentioned before, the column and row decoders 10 and 11 supply a voltage of 5 V to the selected output lines, for example, to the output lines $18_0$ and $19_0$, and ground the unselected output lines, for example the output lines $18_1$ to $18_q$ and $19_1$ to $19_p$. Therefore, if the gate voltage of the depletion transistors (transfer gates) $14_0$ to $14_q$ and $15_0$ to $15_p$ turn to 0 V, the depletion transistors on the selected output lines ($18_0$ and $19_0$) turn off and the depletion transistors on the unselected output lines ($18_1$ to $18_q$ and $19_1$ to $19_p$) are kept in the on state. As a result, the selected column and row lines are kept floating, and the unselected column and row lines are grounded. Therefore, the selected column and row lines $6_0$ and $7_0$ are charged by the charge pump circuits $12_0$ and $13_0$ to the high voltage of 21 V to 25 V, but the unselected column and row lines $6_1$ to $6_q$ and $7_1$ to $7_p$ are not charged by the charge pump circuits (they are kept at 0 V).

During writing, furthermore, the charge pump circuit 32 operates to supply high voltage to the gate of the transistor 31 causing the transistor 31 to turn on. Thus, the high voltage $V_{pp}$ from the voltage multiplier 17 can be applied to each of the bit lines. Since the column line $6_0$ is selected, the bit line selection transistor $4_0$ turns on and the high voltage $V_{PP}$ is applied to the bit line $5_0$. Therefore, information is written with respect to the memory transistor $2_{00}$ which corresponds to the selected row line $7_0$ and bit line $5_0$. On the other hand, during erasing, the charge pump circuit 30 operates to charge the gates of all the memory transistors $2_{00}$ to $2_{pq}$ in the memory cell array 1 up to the high voltage $V_{PP}$. Therefore, the information in a memory cell corresponding to the selected column and row lines can be erased.

Figure 3:
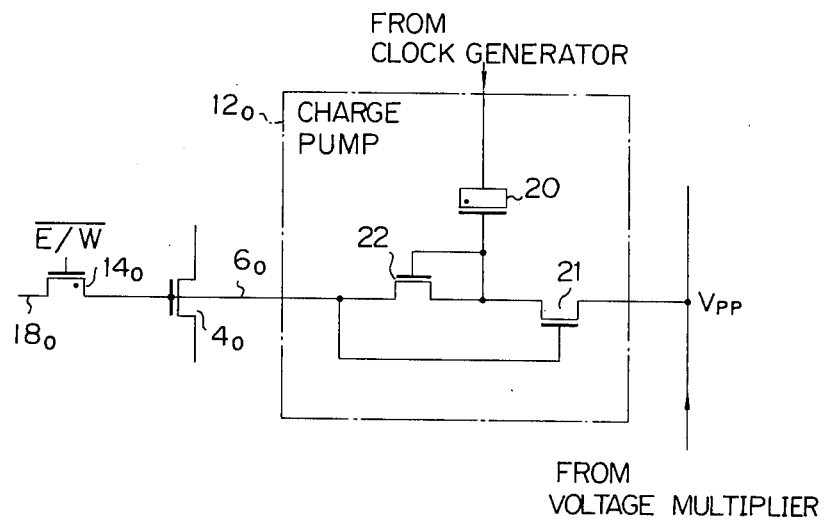
FIG. 3 is a circuit diagram of a prior art charge pump circuit.

FIG. 3 is a circuit diagram of a part of FIG. 1, wherein a prior art charge pump circuit is used for the charge pump circuit $12_0$. In FIG. 3, the output line $18_0$, transfer gate $14_0$, bit line selection transistor $4_0$, and column line $6_0$ are the same as those in FIG. 1. The charge pump circuit $12_o$ includes two transistors 21 and 22 connected in series between the high voltage line $V_{PP}$ and the column line $6_0$, and a metal oxide semiconductor (MOS) capacitor 20. One end of the MOS capacitor 20 is connected to the clock generator 24 (FIG. 1). The other end of the capacitor 20 is connected to the junction of the transistors 21 and 22, and to the gate of the transistor 22. The gate of the transistor 21 is connected to the column line $6_0$.

During writing and erasing, if the column line $6_0$ is selected, since the column line $6_0$ is floating at 5 V, the transistor 21 is on. Thus, the MOS capacitor 20 pumps charge into the column line $6_0$ through the transistor 22 in response to clock pulses from the clock generator 24 (FIG. 1). Since the column line $6_0$ is floating in this case, the voltage thereof increases to the high voltage $V_{pp}$ of 21 V to 25 V, which is supplied from the voltage multiplier 17 (FIG. 1). On the other hand, if the column line $6_0$ is unselected during writing and erasing, since the column line $6_0$ is grounded as described before, the transistor 21 is cut off. Therefore, although clock pulses are applied to the MOS capacitor 20, only a little charge from the high voltage line $V_{pp}$ is transferred to the column line $6_0$. Even if a little charge is transferred to the column line $6_0$, the voltage on the column line $6_0$ will not increase but be kept at 0 V, because it is grounded.

However, according to the charge pump circuit shown in FIG. 3, clock pulses are applied to the MOS capacitor 20 even if the column line $6_0$ is unselected. This means that MOS capacitors in all the charge pump circuits $12_0$ to $12_q$ and $13_0$ to $13_p$ are always the load of the clock generator 24. In the case where the dimension of the one MOS capacitor 20 is W/L = 10 $\mu$m/10 $\mu$m (where W is the channel width and L is the channel length), and there are 256 column lines and 256 row lines in an EEPROM, the total dimension of all the MOS capacitors in the EEPROM becomes very large. Accordingly, the clock generator 24 is required due to the extremely large capacitance of the current.

Furthermore, according to the charge pump circuit shown in FIG. 3, a small amount of current flows from the high voltage line $V_{pp}$ to an unselected column or row line in response to the clock pulses. Since the number of unselected column and row lines is great, the total current leakage from the high voltage line cannot be ignored. This causes the capacitance of the voltage multiplier 17 to increase.

Figure 4:
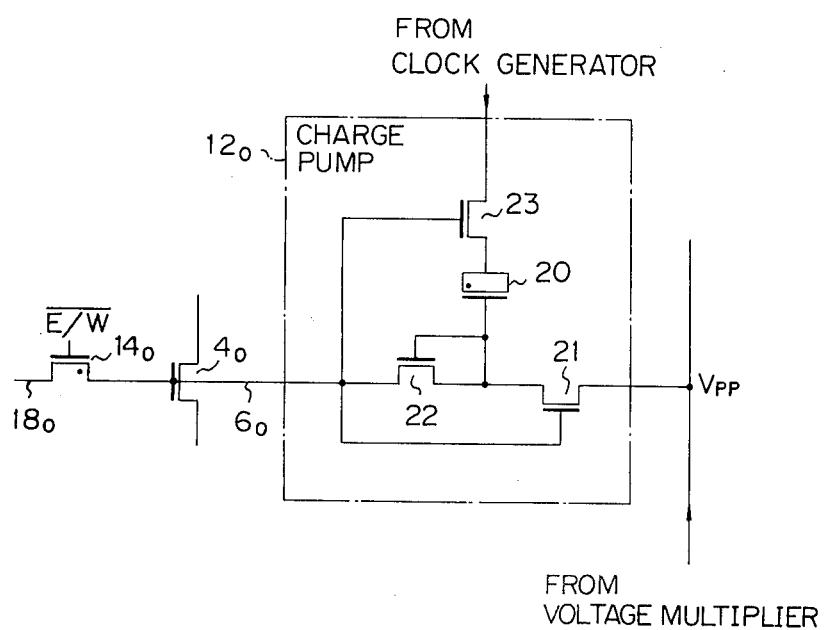
FIG. 4 is a circuit diagram of a charge pump circuit in the embodiment shown in FIG. 1.

The present invention can solve the above-mentioned problem of the prior art. FIG. 4 is a circuit diagram of a part of FIG. 1, wherein a charge pump circuit according to the present invention is used for the charge pump circuit $12_0$. In FIG. 4, the output line $18_0$, transfer gate $14_0$, bit line selection transistor $4_0$, column line $6_0$, MOS capacitor 20, and transistors 21 and 22 are the same as those in FIG. 3. The charge pump circuit in FIG. 4, however, further comprises a transistor 23 connected between the clock generator 24 and the MOS capacitor 20. The gate of the transistor 23 is connected to the column line $6_0$.

During writing and erasing, if the column line $6_0$ is selected, since the column line $6_0$ is floating at 5 V, the transistor 23 is on. Thus, the MOS capacitor 20 is coupled to the clock generator 24 to receive clock pulses and to pump charge onto the column line $6_0$ in response to the clock pulses. On the other hand, if the column line $6_0$ is unselected during writing and erasing, since the column line $6_0$ is grounded, the transistor 23 turns off. Therefore, the MOS capacitor 20 is cut off from the clock generator 24. It will be apparent that, according to the circuit shown in FIG. 4, only charge pump circuits connected to the selected column and row lines become the load of the clock generator 24. The remaining charge pump circuits, which are connected to the unselected column and row lines, do not become the load of the clock generator 24. In fact, the transistor 23 in each of the charge pump circuits connected to the unselected column and row lines will be the load of the clock generator 24 instead of the MOS capacitor 20. Also, the dimension of the transistor 23 is small, i.e., $W/L = 6$ μm/3 μm, and thus the capacitance of the current that flows to the clock generator 24 is extremely small (i.e., less than one tenth of the capacitance of the current that flows to the clock generator 24 when the charge pump circuit shown in FIG. 3 is used).

In the aforementioned description, the present invention is applied to an EEPROM. However, the present invention is applicable to an erasable and programmable read only memory (EPROM) if the current flowing in the memory cells of the EPROM is small.

Many widely different embodiments of the present invention may be constructed without departing from the spirit and scope of the present invention. It should be understood that the present invention is not limited to the specific embodiments described in this specification, except as defined in the appended claims.

We claim:

1. A semiconductor memory device for providing a writing or erasing operation, comprising:
    a plurality of column lines;
    a plurality of row lines;
    a column decoder, operatively connected to said column lines, for selecting one of said column lines;
    a row decoder, operatively connected to said row lines, for selecting one of said row lines;
    a plurality of memory cells, one of said memory cells being accessed by a selected one of said column lines and a selected one of said row lines;
    a clock generator for producing clock pulses;
    a voltage supply for supplying a high voltage; and
    a plurality of charge pump circuits, respectively, operatively connected to said column lines and said row lines and operatively connected to said clock generator and said voltage supply, for increasing the voltage on said selected ones of said column and row lines to the high voltage of said voltage supply during the writing or erasing operation, each of said charge pump circuits comprising:
    a capacitor, operatively connected to said clock generator, charging and discharging in response to the clock pulses from said clock generator;
    a charge transfer transistor, operatively connected to said capacitor, for transferring charge from said voltage supply to said column or row line connected thereto, in response to the charge on said capacitor; and
    gate means, operatively connected between said clock generator and said capacitor, for cutting off said capacitor, if said column or row line connected to said respective charge pump circuit is unselected, from said clock generator.

2. A device as claimed in claim 1, wherein each of said gate means comprises a first transistor operatively connected between said clock generator said said capacitor, said first transistor being on when said column or row line connected to said respective charge pump circuit is selected and being off when said column or row line connected to said respective charge pump circuit is unselected.

3. A device as claimed in claim 2, wherein said charge transfer transistor in each of said charge pump circuits has a gate connected to said respective column or row line.

4. A device as claimed in claim 3, wherein said column and row decoders supply a source voltage to said selected ones of said column and row lines and ground said unselected column and row lines.

5. A device as claimed in claim 4, wherein said device further comprises a plurality of second transistors, operatively connected between said column decoder and said column lines and between said row decoder and said row lines, said second transistors being off only when one of said column lines and one of said row lines connected thereto are selected during the writing and erasing operations so as to cut off the selected ones of said column and row lines from said column and row decoders, respectively.

6. A device as claimed in claim 1, wherein said device further comprises a plurality of transistors operatively connected between said column decoder and said column lines and between said row decoder and said row lines, said transistors being off only when one of said column lines and one of said row lines connected thereto are selected during the writing and erasing operations so as to cut off the selected ones of said column and row lines from said column and row decoders, respectively.

7. A device as claimed in claim 6, wherein each of said memory cells includes:
    a selection transistor, operatively connected to said memory cells, for selecting said memory cells; and
    a memory transistor, operatively connected to said selection transistor, for storing information.

8. A device as claimed in claim 1, wherein each of said memory cells comprises:
    a selection transistor, operatively connected to said memory cells, for selecting said memory cells; and
    a memory transistor, operatively connected to said selection transistor, for storing information.

9. A semiconductor memory device, operatively connectable to receive a supply voltage, for providing a writing or erasing operation, comprising:
    column lines;
    row lines;
    a column decoder, operatively connected to said column lines, for selecting one of said column lines;
    a row decoder, operatively connected to said row lines, for selecting one of said row lines;
    memory cells, operatively connected to said column lines and said row lines, one of said memory cells being accessed by a selected one of said column lines and a selected one of said row lines;
    a clock generator for producing clock pulses;

a voltage multiplier, operatively connected to receive the supply voltage and operatively connected to said clock generator, for supplying a voltage higher than the supply voltage; and charge pump circuits, respectively, operatively connected to said column and row lines and operatively connected to said clock generator and said voltage multiplier, for increasing the voltage on said selected ones of said column and row lines to the high voltage of said voltage multiplier during the writing or erasing operation, each of said charge pump circuits comprising:

a capacitor, operatively connected to said clock generator, for charging and discharging in response to the clock pulses from said clock generator;

a charge transfer transistor, operatively connected to said capacitor and said voltage multiplier, for transferring charge from said voltage multiplier to said column or row line connected thereto, in response to the charge on said capacitor; and gate means, operatively connected between said clock generator and said capacitor, for cutting off said capacitor, in said charge pump circuits connected to an unselected column or row line, from said clock generator.

* * * * *